(12) United States Patent
Wu et al.

(10) Patent No.: US 10,840,400 B2
(45) Date of Patent: Nov. 17, 2020

(54) PHOTOVOLTAIC DEVICE WITH BACK REFLECTOR

(71) Applicant: TSMC SOLAR LTD., Taichung (TW)

(72) Inventors: Jyh-Lih Wu, Tainan (TW); Li Xu, Taichung (TW); Wen-Tsai Yen, Caotun Township (TW); Chung-Hsien Wu, Luzhu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 672 days.

(21) Appl. No.: 14/013,099

(22) Filed: Aug. 29, 2013

(65) Prior Publication Data

US 2015/0059850 A1 Mar. 5, 2015

(51) Int. Cl.
*H01L 31/0445* (2014.01)
*H01L 31/056* (2014.01)
*H01L 31/0749* (2012.01)
*H01L 31/0232* (2014.01)

(52) U.S. Cl.
CPC ........ *H01L 31/0445* (2014.12); *H01L 31/056* (2014.12); *H01L 31/0749* (2013.01); *Y02E 10/52* (2013.01); *Y02E 10/541* (2013.01); *Y02P 70/521* (2015.11)

(58) Field of Classification Search
CPC ............. H01L 31/056; H01L 31/02327; G02F 2201/346
See application file for complete search history.

(56) References Cited

U.S. PATENT DOCUMENTS

| 5,569,332 | A | * | 10/1996 | Glatfelter | H01L 31/076 136/249 |
| 5,635,408 | A | * | 6/1997 | Sano | H01L 31/075 136/249 |
| 5,828,088 | A | * | 10/1998 | Mauk | H01L 31/0232 136/259 |
| 6,072,117 | A | * | 6/2000 | Matsuyama | H01L 31/02246 136/256 |
| 9,166,077 | B2 | | 10/2015 | Hakuma et al. | |
| 2002/0133129 | A1 | * | 9/2002 | Arias | A61B 5/1411 604/272 |

(Continued)

FOREIGN PATENT DOCUMENTS

CN 101924159 A 12/2010
CN 102934235 A 2/2013

OTHER PUBLICATIONS

Polyanskiy "Refractive index database," http://refractiveindex.info (accessed Feb. 30, 2016).*

(Continued)

*Primary Examiner* — Magali P Slawski
(74) *Attorney, Agent, or Firm* — Duane Morris LLP

(57) ABSTRACT

A device and method of improving efficiency of a thin film solar cell by providing a back reflector between a back electrode layer and an absorber layer. Back reflector reflects sunlight photons back into the absorber layer to generate additional electrical energy. The device is a photovoltaic device comprising a substrate, a back electrode layer, a back reflector, an absorber layer, a buffer layer, and a front contact layer. The back reflector is formed as a plurality of parallel lines.

8 Claims, 7 Drawing Sheets

(56) References Cited

U.S. PATENT DOCUMENTS

| | | | | | |
|---|---|---|---|---|---|
| 2005/0006221 | A1* | 1/2005 | Takeuchi | | C23C 14/0623 |
| | | | | | 204/192.1 |
| 2005/0034755 | A1* | 2/2005 | Okada | | B32B 17/06 |
| | | | | | 136/256 |
| 2006/0033113 | A1* | 2/2006 | Lee | | H01L 33/46 |
| | | | | | 257/80 |
| 2006/0221450 | A1* | 10/2006 | Wang | | G01J 3/02 |
| | | | | | 359/584 |
| 2009/0084438 | A1* | 4/2009 | den Boer | | H01L 31/02168 |
| | | | | | 136/256 |
| 2009/0315148 | A1* | 12/2009 | Aksu | | C25D 3/54 |
| | | | | | 257/613 |
| 2010/0178417 | A1* | 7/2010 | Connor | | B82Y 20/00 |
| | | | | | 427/74 |
| 2010/0206362 | A1* | 8/2010 | Flood | | H01L 31/0336 |
| | | | | | 136/252 |
| 2010/0282297 | A1 | 11/2010 | Seikimoto et al. | | |
| 2011/0108100 | A1* | 5/2011 | Yu | | H01L 31/02168 |
| | | | | | 136/255 |
| 2011/0146782 | A1* | 6/2011 | Gabor | | H01L 21/228 |
| | | | | | 136/256 |
| 2011/0214709 | A1* | 9/2011 | Evelsizer | | H01L 31/035227 |
| | | | | | 136/244 |
| 2012/0244702 | A1* | 9/2012 | Baccini | | H01L 31/02245 |
| | | | | | 438/667 |
| 2013/0074925 | A1 | 3/2013 | Hakuma et al. | | |
| 2014/0026955 | A1* | 1/2014 | Nishimoto | | H01L 31/02245 |
| | | | | | 136/256 |

OTHER PUBLICATIONS

Polyanskiy "Refractive index database," http://refractiveindex.info (accessed Sep. 21, 2016).*

Gloeckler et al. ("Potential of submicrometer thickness Cu(In,Ga)Se2 solar cells" Journal of Applied Physics 98, 103703 (2005) (Year: 2005).*

Krc, J. et al., A Presentation on "Optical modeling and simulation of thin-film Cu(In,Ga)Se2 solar cells", University of Ljubljana, Faculty of Electrical Engineering, Ljubljana, Slovenia and Uppsala University, Angstrom Solar Center, Uppsala, Sweden, 29 pages.

U.S. Appl. No. 61/777,470, filed Mar. 12, 2013.

U.S. Appl. No. 13/689,091, filed Nov. 29, 2012.

U.S. Appl. No. 13/934,251, filed Jul. 3, 2013.

Official Action dated Mar. 3, 2016 in counterpart Chinese patent application No. 2016022901436450.

* cited by examiner

PHOTOVOLTAIC DEVICE WITH BACK REFLECTOR

FIELD

The present disclosure generally relates to photovoltaic devices and, more particularly, to a back reflector for improving the performance of thin film solar cells.

BACKGROUND

Thin film solar cells, also known as thin film photovoltaic cells, are used to convert light energy directly into electrical energy. The manufacture of thin film solar cells includes the steps of sequentially depositing one or more thin film layers onto a substrate. A typical thin film solar cell includes a front contact layer, a buffer layer, an absorber layer, a back electrode layer, and the substrate.

The front contact layer, also called the top contact or window layer, is typically an n-type transparent conductive oxide layer with an anti-reflective coating. The buffer layer is typically an n-type layer, while the absorber layer is typically a p-type layer. The absorber layer can be a "CIGS-based" absorber, where "CIGS" generally refers to Copper-Indium-Gallium-Selenide or $Cu(In,Ga)Se_2$. The back electrode layer is generally metallic and typically comprised of molybdenum (Mo). The substrate is typically made of glass, plastic, or metal-foil. In thin film solar cells with a metal-foil substrate, the back electrode layer can be omitted because the substrate serves as a back electrode layer.

As photons from sunlight pass through the thin film solar cell, the electron-hole pairs are generated in the photoactive absorber. They can be separated due to the built-in electric field within the buffer layer—absorber layer junction. The resulting holes and electrons are collected by the back electrode and the top contact, respectively, giving rise to photocurrent.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout specification and drawing.

DETAILED DESCRIPTION

Figure 1:
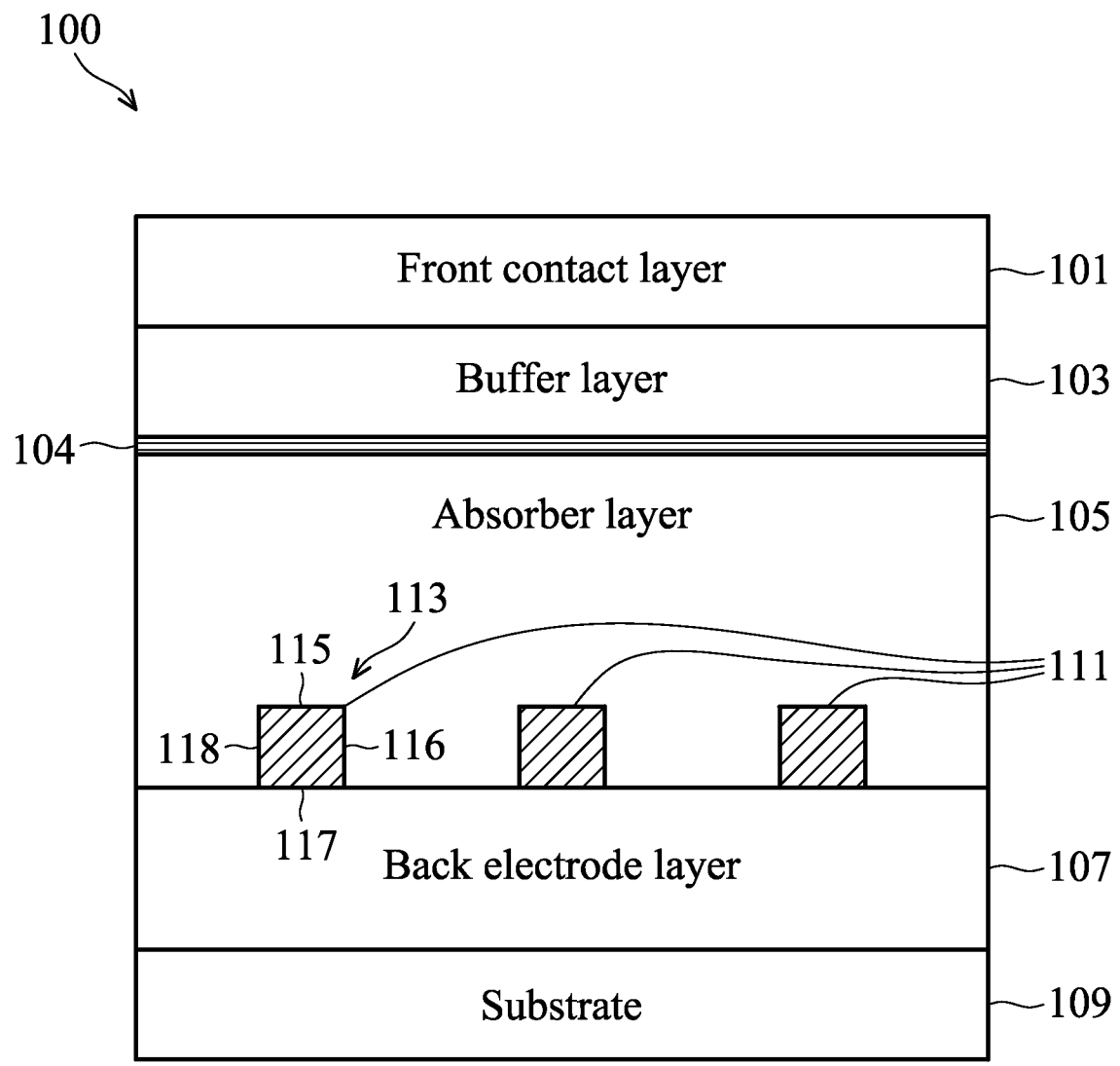
FIG. 1 is a simplified block diagram of a thin film solar cell with a back reflector in accordance with some embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Many of the photons entering a thin film solar cell are absorbed by the cell when their energy is larger than the energy bandgap of the light absorber. However, a non-negligible portion of the photons entering a thin film solar cell are not absorbed by the cell and reach the back electrode layer. These photons are either reflected back into the absorber layer—potentially creating more electrical energy—or absorbed into the back electrode layer.

A back electrode layer made from Molybdenum (Mo) poorly reflect photons. The introduction of selenium atoms during formation of the CIGS-based absorber layer creates molybdenum selenide (MoSe2) on the surface of the back electrode layer, which further diminishes the back electrode layer's ability to reflect photons.

The present disclosure provides a back reflector, disposed between a back electrode layer and an absorber layer, to improve photon reflection in a thin film solar cell. A method of improving photon reflection in a thin film solar cell is disclosed comprising the sequential deposition of thin film layers, including a back reflector layer, on a substrate to form a thin film solar cell.

Improving the reflectivity of the back electrode layer results in more photons reflecting back into the absorber layer and being converted to electrical energy. Thus, improving the reflectivity of the back electrode layer improves the efficiency of a thin film solar cell.

FIG. 1 is a simplified block diagram of a cross-section view of a thin film solar cell 100 in accordance with some embodiments of the present disclosure. The front contact layer 101, also called the top contact or window layer, is typically an n-type transparent conductive oxide (TCO) with an anti-reflective coating to prevent sunlight photons from reflecting off the surface of thin film solar cell 100. The front contact layer 101 can comprise a single layer or multiple layers. Examples of suitable material for the front contact layer 101 include but are not limited to transparent conductive oxides such as indium tin oxide (ITO), fluorine-doped tin oxide (FTO), aluminum-doped zinc oxide (AZO), gallium doped ZnO (GZO), alumina and gallium co-doped ZnO (AGZO), boron doped ZnO (BZO), and any combinations thereof. A suitable material for the front contact layer 101 can also be a composite material comprising at least one of the transparent conductive oxide (TCO) and another conductive material, which does not significantly decrease electrical conductivity or optical transparency of the front contact layer 101. The thickness of the front contact layer 101 is in the order of nanometers or microns, for example in the range of from about 0.3 nm to about 2.5 µm in some embodiments.

The buffer layer 103 is typically an n-type layer. In some embodiments, the buffer layer 103 is formed from CdS, ZnS, ZnO, $In_2S_3$, $In_2Se_3$, $Zn_{1-x}Mg_xO$, or ZnSe. Other suitable buffer layer materials can be used. The thickness of the buffer layer 103 is on the order of nanometers, for example, in the range of from about 5 nm to about 100 nm in some embodiments.

In some embodiments, the buffer layer 103 is formed through a suitable process such as sputtering or chemical vapor deposition. For example, in some embodiments, the buffer layer 103 is a layer of CdS, ZnS or a mixture of CdS and ZnO, deposited through a hydrothermal reaction or chemical bath deposition (CBD) in a solution. For example, in some embodiments, a buffer layer 103 comprising a thin film of ZnS is formed above absorber layer 105 comprising a "CIGS-based" absorber, where "CIGS" generally refers to Copper-Indium-Gallium-Selenide or $Cu(In,Ga)Se_2$. The buffer layer 103 is formed in an aqueous solution comprising ZnSO4, ammonia and thiourea at 80 Celsius. A suitable solution comprises 0.16 M of ZnSO4, 7.5 M of ammonia, and 0.6 M of thiourea in some embodiments.

A junction 104 is formed between buffer layer 103 and absorber layer 105.

The absorber layer 105 is typically a p-type layer. In some embodiments, the absorber layer 105 is a "CIGS-based" absorber. In some embodiments, the absorber layer 105 is sputtered using a CuGa sputter target (not shown) and an indium-based sputtering target (not shown). In some other embodiments, the CuGa material is sputtered first to form one metal precursor layer and the indium-based material is next sputtered to form an indium-containing metal precursor layer on the CuGa metal precursor layer. In other embodiments, the CuGa material and indium-based material are sputtered simultaneously, or on an alternating basis.

In other embodiments, the absorber layer 105 comprises copper (Cu), gallium (Ga), indium (In), aluminum (Al), selenium (Se), selenide (S), and combinations thereof. In still other embodiments, the absorber layer 105 comprises different materials, such as $CuInSe_2$ (CIS), $CuGaSe_2$ (CGS), $Cu(In,Ga)Se_2$ (CIGS), $Cu(In,Ga)(Se,S)_2$ (CIGSS), CdTe and amorphous silicon. Other embodiments include still other absorber layer materials.

In yet another embodiment, the absorber layer 105 is formed by a different technique that provides suitable uniformity of composition. For example, the Cu, In, Ga and $Se_2$ can be coevaporated and simultaneously delivered by chemical vapor deposition (CVD) followed by heating to a temperature in the range of 400 C to 600 C. In other embodiments, the Cu, In, and Ga are delivered first, and then the absorber layer is annealed in an Se atmosphere at a temperature in the range of 400 C to 600 C.

In other embodiments, the absorber layer 105 is formed using methods such as chemical vapor deposition, printing, electrodeposition or the like.

The absorber layer 105 has a thickness on the order of nanometers or micrometers, for example, from about 0.2 microns to about 10 microns. In some embodiments, the absorber layer 105 has a thickness from about 200 nm to about 3 microns. In some embodiments, the absorber layer 105 has a thickness of about 1 micrometer or more.

The back electrode layer 107, also called the back contact or bottom contact layer, is generally metallic and typically comprised of molybdenum (Mo) or molybdenum composites. Other embodiments include other suitable back contact materials, such as Pt, Au, Ag, Ni, or Cu, instead of Mo. For example, in some embodiments, a back electrode layer 107 of copper or nickel is provided, above which a cadmium telluride (CdTe) absorber layer 105 can be formed. The thickness of the back electrode layer 107 is on the order of nanometers or micrometers, for example, in the range of from about 100 nm to about 20 microns in some embodiments.

The substrate 109 is typically made of glass, plastic, or metal-foil. In a thin film solar cell 100 with a metal-foil substrate 109, the back electrode layer 107 can be omitted as the substrate 109 serves as a back electrode layer 107. This embodiment is further described with relation to FIG. 2.

As photons from sunlight pass through the thin film solar cell 100, the electron-hole pairs are generated in the absorber layer 105. They are separated by the built-in electric field due to the formation of the junction 104. The electrons are collected by the n-type front contact layer 101; the holes are collected by the back electrode layer 107.

A back reflector 111 is disposed within the absorber layer 105 and adjacent to the back electrode layer 107. Back reflector 111 is a term used to collectively describe a plurality of lines 113 formed on top of back electrode layer 107, such that a first side 117 is in contact with back electrode layer 107. Absorber layer 105 is then formed on top of back electrode layer 107 and back reflector 111, such that a second side 118, third side 115, and fourth side 116 of each of the plurality of lines 113 are in contact with absorber layer 105. The back reflector 111 has a thickness on the order of nanometers or micrometers, for example, from about 0.1 microns to about 2 microns. In some embodiments, the back reflector 111 has a thickness in a range from 100 nanometers to 500 nanometers.

Figure 2:
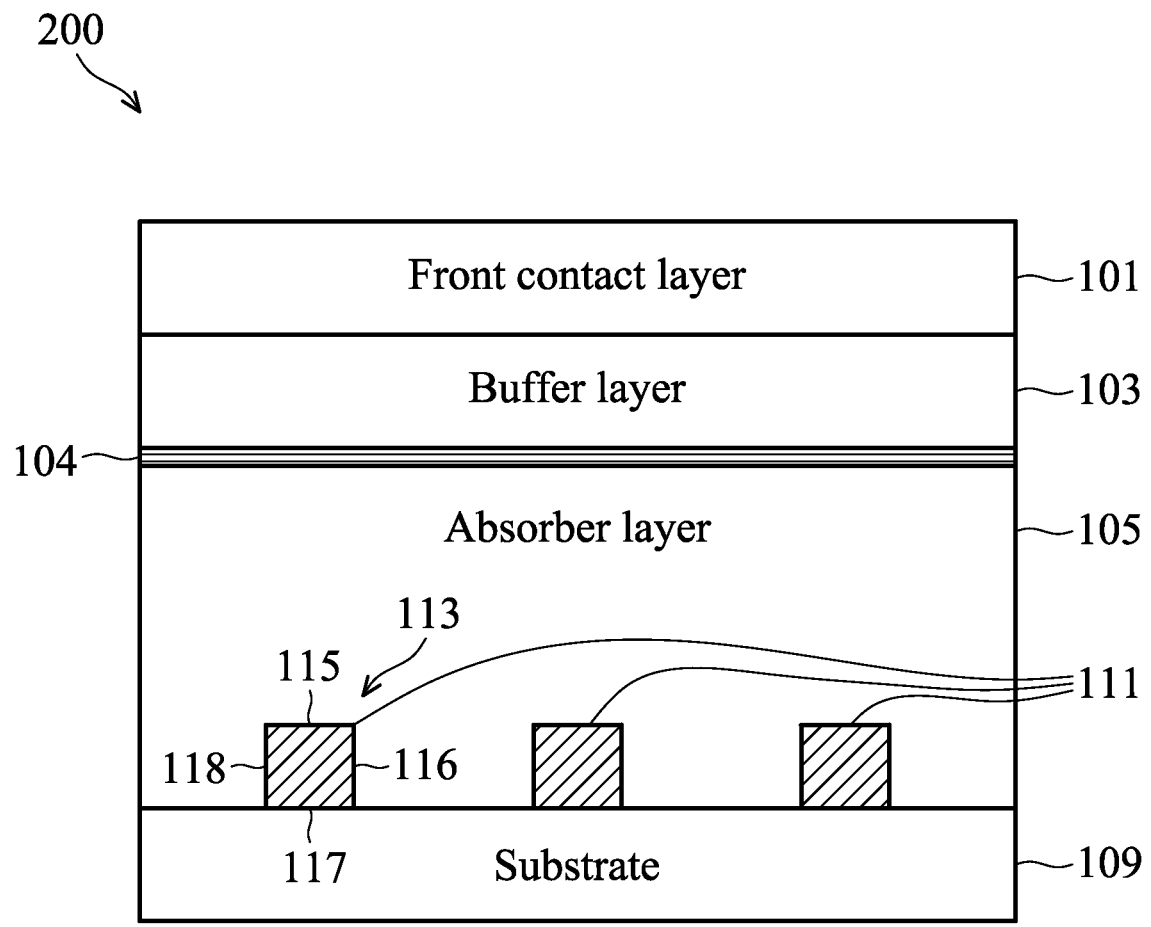
FIG. 2 is a simplified block diagram of a thin film solar cell with a back reflector in accordance with some embodiments of the present disclosure.

FIG. 2 is a simplified block diagram of a cross-section view of an alternate thin film solar cell 200 in accordance with some embodiments of the present disclosure. The alternate thin film solar cell 200 has a substrate 109 formed from metal-foil. The metal-foil substrate 109 serves as both a substrate 109 and electrical conductor, negating the need for a back electrode layer 107. Thus the back reflector 111 is disposed within the absorber layer 105 and adjacent to the substrate 109.

Figure 3:
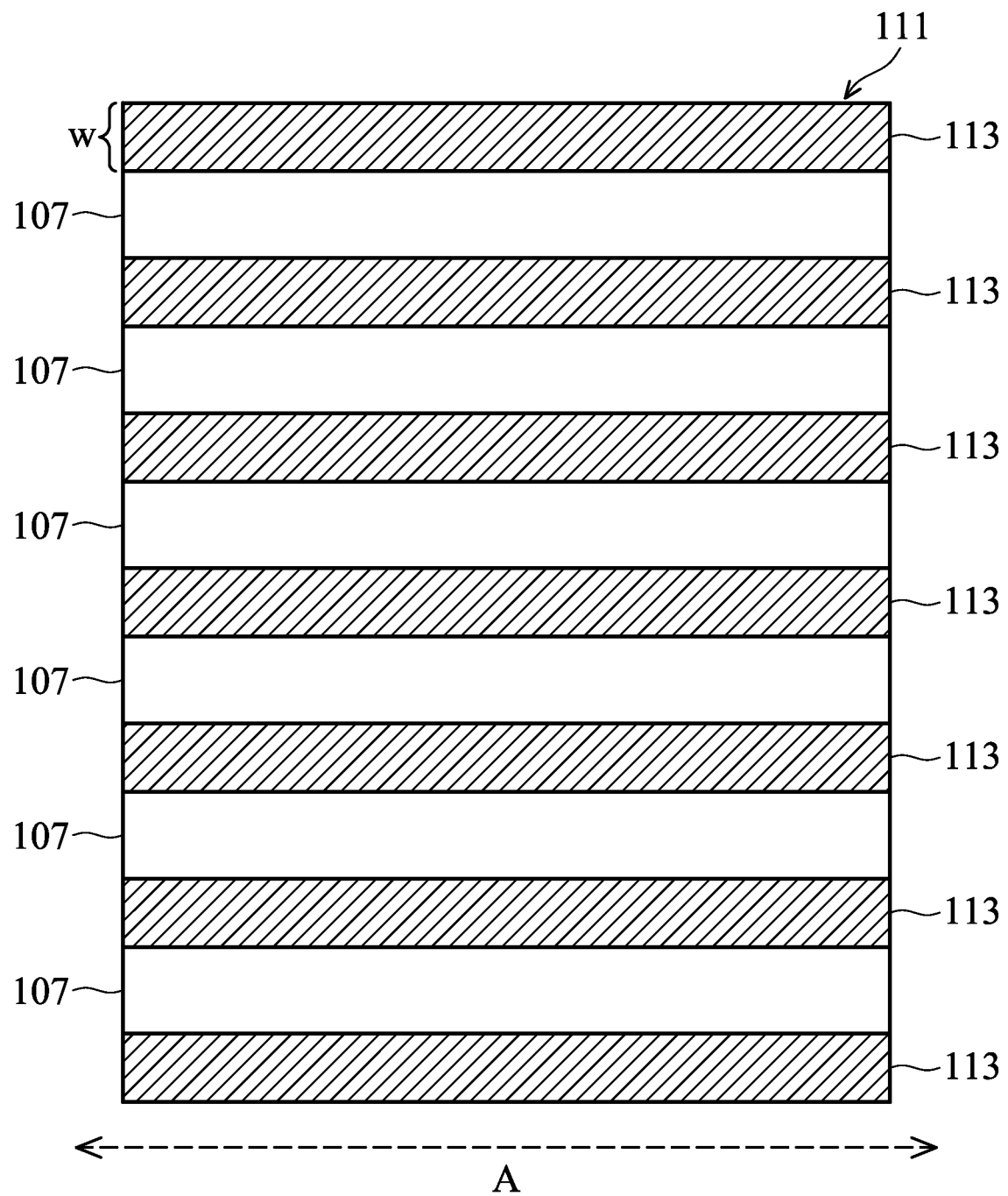
FIG. 3 is top plan view of the plurality of lines comprising a back reflector in accordance with some embodiments of the present disclosure.

FIG. 3 is top plan view of the plurality of lines 113 constituting a back reflector 111 in accordance with some embodiments of the present disclosure. The plurality of lines 113 are formed on the surface of back electrode layer 107 as a plurality of parallel lines 113 disposed parallel to a first axis A and parallel to each other. In FIG. 3, lines 113 are illustrated as shaded regions while the underlying back electrode layer 107 is illustrated as the non-shaded regions.

In some embodiments, additional lines 113 are added parallel to a second axis, where first axis A and second axis B are perpendicular or non-parallel to each other, to create a mesh or grid configuration for back reflector 111.

During deposition of materials forming the plurality of lines 113, a mask or screen can be used to create the plurality of parallel lines 113. In some embodiments, the reflector material is sputtered onto surface of the back electrode layer 107 using a mask. In other embodiments, the reflector is deposited on the surface of the back electrode layer 107 by vapor deposition using a mask.

Back reflector 111 is formed in the plurality of parallel lines 113 to allow for improved reflectivity while ensuring direct contact remains between absorber layer 105 and back electrode layer 107 to minimize impediments to hole collection at the back electrode layer 107.

In some embodiments, the coverage ratio of back reflector 111 to absorber layer 105 is adjusted by adjusting the width (w) of one or more of the plurality of lines 113. The coverage ratio should maximize reflectivity of the thin film solar cell 100 while also having a minimal or acceptable impact on the electrical performance of the thin film solar cell 100. Increasing the width (w) of one or more of the plurality of lines 113 will increase the electrical resistance of the thin film solar cell 100, causing degradation of electrical performance. In some embodiments, the coverage ratio of back reflector 111 to absorber layer 105 is between 20% and 90%. In some embodiments, the coverage ratio of back reflector 111 to absorber layer 105 is between 50% and 80%.

Figure 4A:
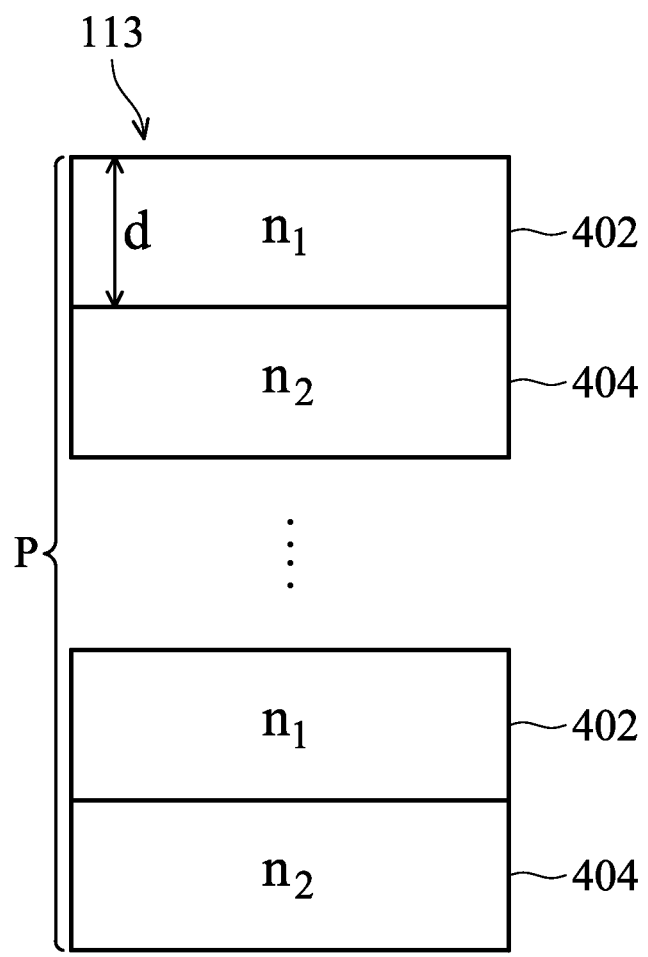
FIG. 4A is a simplified block diagram of a cross-section view of a single line of a back reflector in accordance with some embodiments of the present disclosure.

FIG. 4A is a simplified block diagram of a single line 113 of back reflector 111 in accordance with some embodiments of the present disclosure. In some embodiments, the line 113 is formed from at least one layer of a first reflector material 402 and at least one layer of a second reflector material 404. In some embodiments, additional materials beyond first reflector material 402 and second reflector material 404 are used.

In some embodiments, some or all of the lines 113 comprise a single layer of a first reflector material 402 and a single layer of a second reflector material 404, forming a material pair, designated p. In some embodiments, some or all of the lines 113 comprise a plurality of material pairs p.

First reflector material 402 and second reflector material 404 are selected to achieve a high photon reflectivity. In some embodiments, first reflector material 402 and second reflector material 404 are selected based on their refractive index, which measures how light propagates through a material. The reflectivity of back reflector 111 at various light wavelengths can be adjusted by selecting materials with a higher or lower refractive index as first reflector material 402 and second reflector material 404.

In some embodiments, first reflector material 402 has a refractive index between 1.5 and 4.5. In some embodiments, second reflector material 404 has a refractive index between 1.2 and 2.5.

The depth (d) of each layer of first reflector material 402 and second reflector material 404 can be adjusted to improve reflectivity based on the materials selected for first reflector material 402 and second reflector material 404. In some embodiments, the depth (d) of each layer of the first reflector material 402 and second reflector material 404 is between 30 nanometers and 300 nanometers.

In some embodiments, first reflector material 402 is Silicon (Si) with a refractive index of 3.6 and second reflector material 404 is Silicon Oxide (SiOx) with a refractive index of 1.46.

In some embodiments, the line 113 of back reflector 111 is formed only from a first reflector material 402 having a refractive index between 1.2 and 3.0 in a layer having a thickness between 30 nanometers and 2000 nanometers.

Figure 4B:
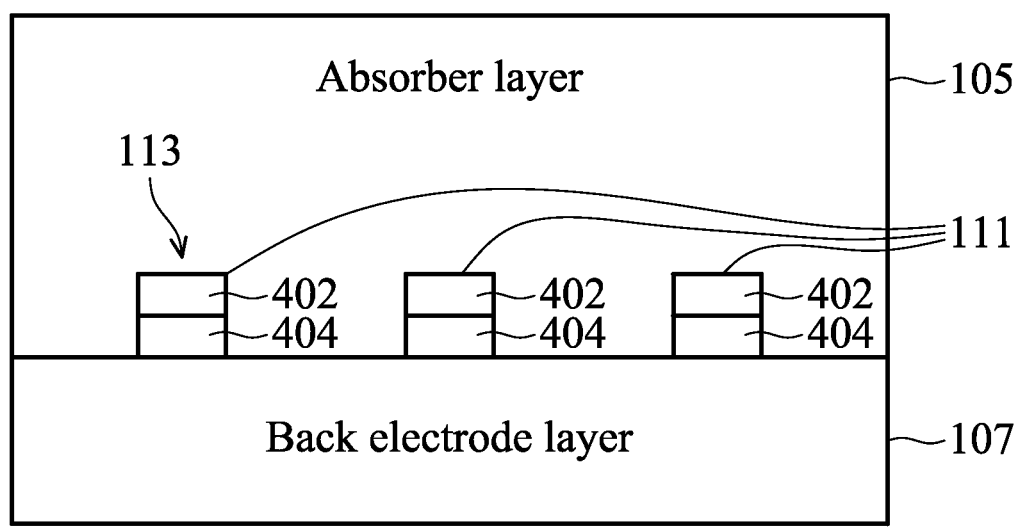
FIG. 4B is a simplified block diagram of a cross-section view of a back reflector formed between a back electrode layer and an absorber layer in accordance with some embodiments of the present disclosure.

FIG. 4B is a simplified block diagram of a cross-section view of a back reflector 111 disposed between a back electrode layer 107 and an absorber layer 105 in accordance with some embodiments of the present disclosure. Second reflector material 404 is formed in contact with back electrode layer 107. First reflector material 402 is added on top of second reflector material 404. In the embodiment illustrated in FIG. 4B, lines 113 comprise a single layer of a first reflector material 402 and a single layer of a second reflector material 404, forming a material pair, designated p.

In some embodiments, not illustrated in FIG. 4B, back reflector 111 is formed from a plurality of material pairs p. Additional layers of first reflector material 402 and second reflector material 404 are subsequently added above the initial layer of second reflector material 404 which is in contact with back electrode layer 107.

Thin film solar cell 100 is formed by the sequential deposition of thin film layers on a substrate 109. The thin film layers can be deposited on a substrate 109 by any suitable method, including chemical deposition or physical deposition such as sputtering. The present disclosure further provides a method of forming a thin film solar cell 100 with a back reflector 111.

Figure 5:
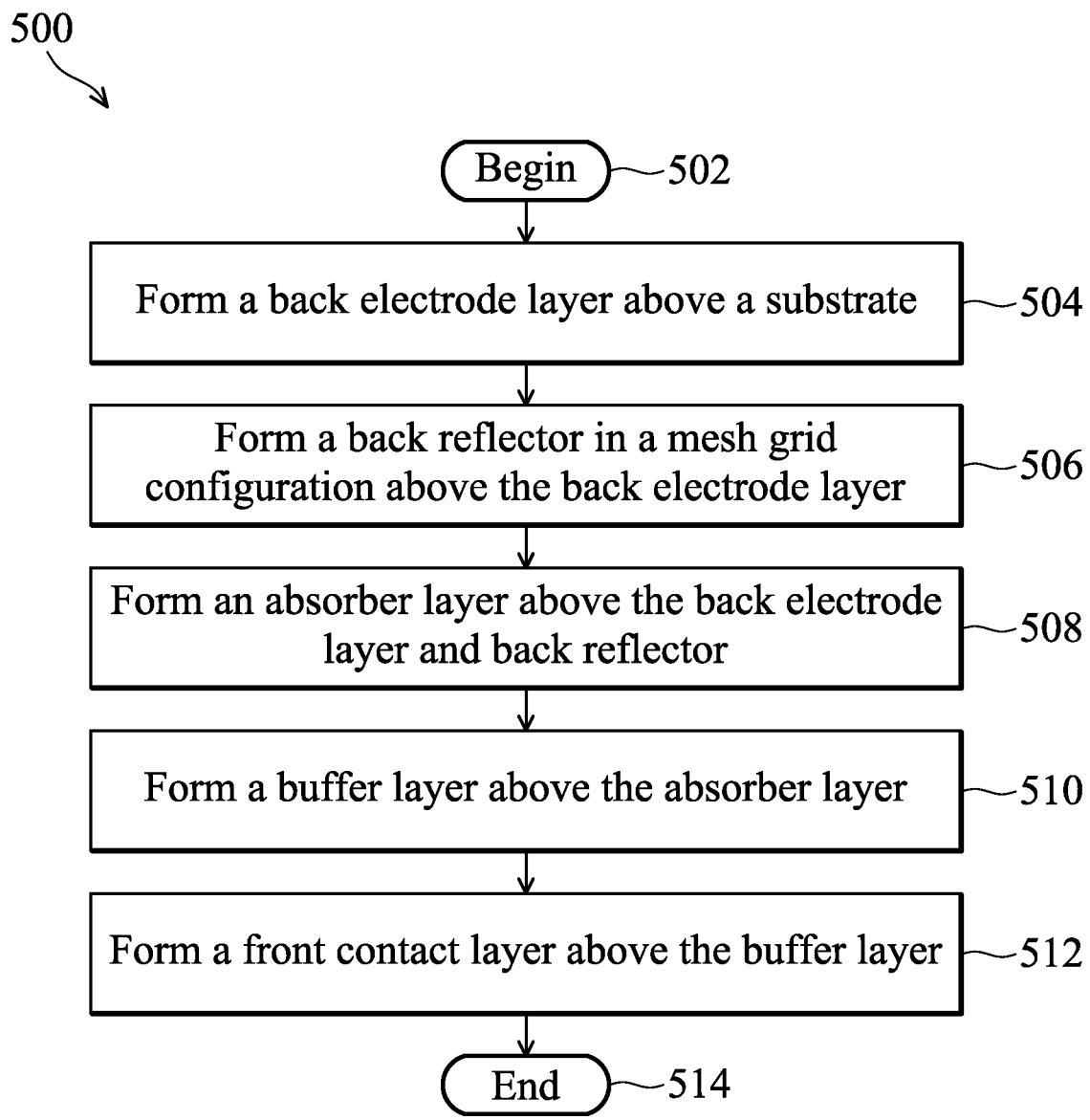
FIG. 5 is a flow diagram of a method in accordance with some embodiments.

FIG. 5 is a flow diagram of a method 500 in accordance with some embodiments of the present disclosure.

After method 500 begins at block 502, a back electrode layer 107 is formed above the substrate 109 at block 504. In some embodiments, a molybdenum back electrode layer 107 is formed on the substrate 109 by sputtering.

At block 506, back reflector 111, comprising a plurality of lines 113, is formed above the back electrode layer 107 as a plurality of parallel lines 113. In some embodiments, this step includes sputtering a first layer of a second reflector material 404 on the back electrode layer 107 and sputtering a second layer of a first reflector material 402 on the first layer of second reflector material 404, where the reflector materials used to form first and second layers have different refractive indices from each other.

At block 508 an absorber layer 105 is formed above the back electrode layer 107 and back reflector 111.

At block 510, a buffer layer 103 is formed above the absorber layer 105. At block 512 a front contact layer 101 is formed above the buffer layer 103, and the process ends at block 514.

Figure 6:
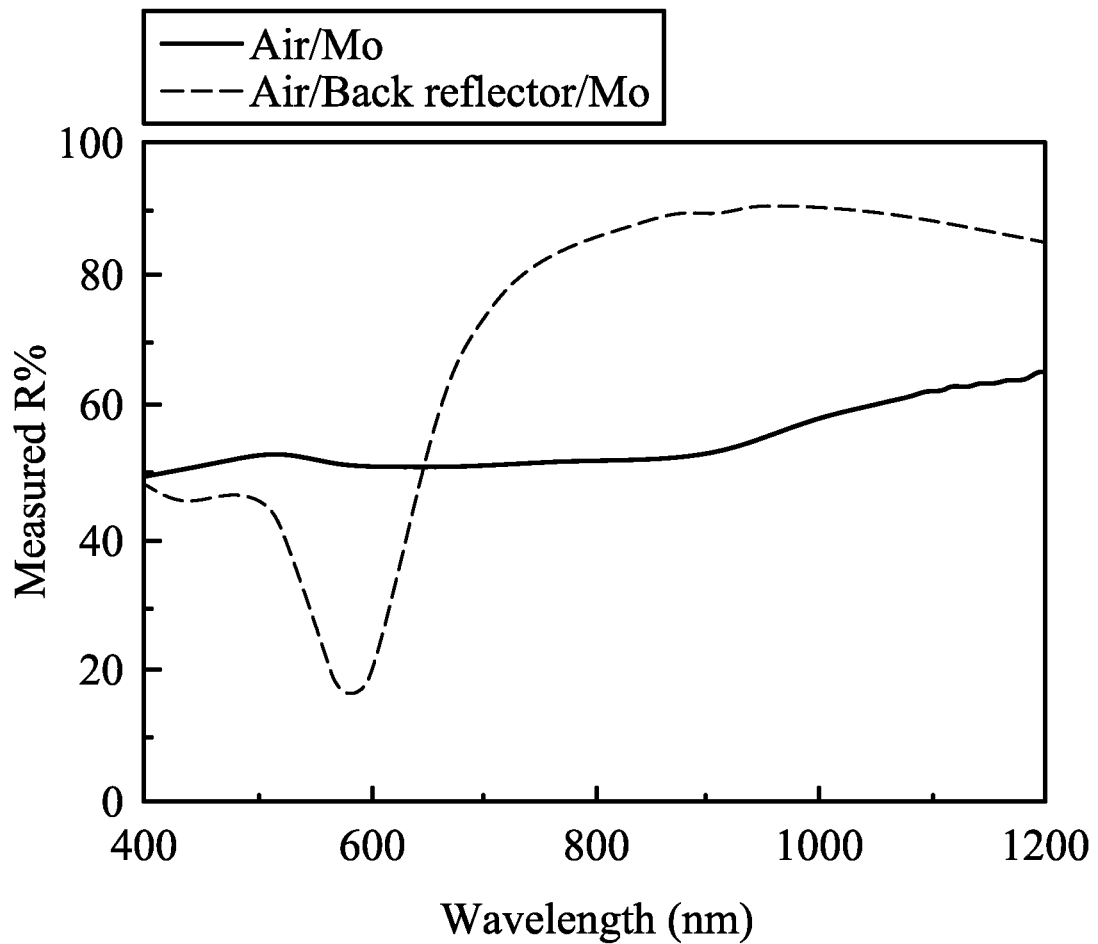
FIG. 6 is a graph of preliminary experimental data comparing the light reflectance of a molybdenum back electrode layer with and without a back reflector.

FIG. 6 is a graph of experimental data comparing the light reflectance of a molybdenum back electrode layer 107 with and without a back reflector 111. The back reflector comprises Si as the first reflector material 402 and SiOx as the second reflector material. The back electrode is fully covered by the back reflector for the specific purpose of optical measurement. For a molybdenum back electrode layer 107 without a back reflector 111, the sunlight photon reflectivity between photon wavelengths 400 to 1200 nanometers ranges from approximately 50% to approximately 65%. However, for a molybdenum back electrode layer 107 with a back reflector 111, the sunlight photon reflectivity dips below 20% at approximately 580 nanometers of photon wavelength before rising above 80% reflectivity between 750 and 1200 nanometers of photon wavelength. FIG. 6 thus illustrates the potential gains in sunlight photon reflectivity from the introduction of a back reflector 111 on a molybdenum back electrode layer 107.

The thin film solar cell with back reflector described above has several advantages. First, the improved photon reflectivity provided by the back reflector results in the absorption of more sunlight photons in the solar cell. This creates a more efficient solar cell, with a greater electrical output for a constant sunlight input.

Second, improved reflectivity may allow a manufacturer to reduce the depth of the absorber layer, which may reduce manufacturing costs of a solar cell. Depth of the absorber layer can be reduced to create a fully depleted cell. In a fully depleted cell, the entire absorber layer is within the depletion region of the p-n junction formed by the buffer layer and the absorber layer. The depletion region is the region with built-in potential for efficient separation of electron-hole pairs, and an absorber layer with a depth matching the depth of the depletion region is an efficient use of absorber material, because no extra or unnecessary absorber material is used. In some embodiments, an absorber layer depth of approximately 1 micron creates a fully depleted cell.

Additionally, by using the plurality of parallel lines, the back reflector does not substantially of unacceptably interfere with the electrical performance of the solar cell. The line structure is easy to manufacture through the use of a metal mask during deposition of the back reflector, so manufacturing costs should not be substantially impacted by the inclusion of a back reflector.

Although examples are illustrated and described herein, embodiments are nevertheless not limited to the details shown, since various modifications and structural changes can be made therein by those of ordinary skill within the scope and range of equivalents of the claims. Although the present disclosure is directed to thin film solar cells, back reflectors can be further applied to other types of solar cells, other photovoltaic systems and apparatuses, and other semiconductor or optical devices.

In some embodiments, a photovoltaic device comprises a substrate; a back electrode layer, formed above the substrate; a back reflector, formed above the back electrode layer; an absorber layer, formed above the back electrode layer and the back reflector; a buffer layer, formed above the absorber layer; and a front contact layer, formed above the buffer layer. In some embodiments, the back reflector is formed as a plurality of parallel lines. In some embodiments, the back reflector is formed in a mesh configuration. In some embodiments, the back reflector is formed from at least one layer each of a first reflector material and a second reflector material, the second reflector material formed in contact with the back electrode layer and the first reflector material formed above the second reflector material. In some embodiments, the first reflector material has a refractive index greater than the refractive index of the second reflector material. In some embodiments, the first reflector material has a refractive index between 1.5 and 4.5 and the second reflector material has a refractive index between 1.2 and 2.5. In some embodiments, each one of the at least one layer of first reflector material and second reflector material forming the back reflector has a depth between 30 and 300 nanometers. In some embodiments, the back reflector covers between 20% and 90% of a surface area of the back electrode layer. In some embodiments, the back reflector covers between 50% and 80% of a surface area of the back electrode layer. In some embodiments, the back reflector is formed by sputtering using a mask. In some embodiments, the back reflector is formed by chemical vapor deposition using a mask.

In some embodiments, a method of forming a photovoltaic device on a substrate comprises forming a back electrode layer above a substrate; forming a back reflector comprising a plurality of parallel lines above the back electrode layer; forming an absorber layer above the back electrode layer and the back reflector; forming a buffer layer above the absorber layer; and forming a front contact layer above the buffer layer. In some embodiments, the back reflector is formed in a mesh configuration. In some embodiments, the back reflector is formed from at least one layer each of a first reflector material and a second reflector material, the second reflector material formed in contact with the back electrode layer and the first reflector material formed above the second reflector material. In some embodiments, the first reflector material has a refractive index greater than the refractive index of the second reflector material. In some embodiments, the first reflector material has a refractive index between 1.5 and 4.5 and the second reflector material has a refractive index between 1.2 and 2.5. In some embodiments, each one of the at least one layer of first reflector material and second reflector material forming the back reflector has a depth of about 30 nanometers to 300 nanometers. In some embodiments, the back reflector covers from 20% to 90% of a surface area of the back electrode layer. In some embodiments, the back reflector covers between 50% and 80% of a surface area of the back electrode layer. In some embodiments, the back reflector is formed by sputtering using a mask. In some embodiments, the back reflector is formed by chemical vapor deposition using a mask.

In some embodiments, a photovoltaic device comprises a substrate, comprising glass, plastic, or metal-foil; a back electrode layer, above the substrate; a back reflector, above the back electrode layer and covering between 20% and 90% of a surface area of the back electrode layer, the back reflector formed from at least one layer each of a first reflector material and a second reflector material, the second reflector material formed in contact with the back electrode layer and the first reflector material formed above the second reflector material, wherein the first reflector material has a refractive index greater than the refractive index of the second reflector material; an absorber layer, above the back electrode layer and the back reflector; a buffer layer, above the absorber layer; and a front contact layer, formed above the buffer layer.

Although examples are illustrated and described herein, embodiments are nevertheless not limited to the details shown, since various modifications and structural changes can be made therein by those of ordinary skill within the scope and range of equivalents of the claims.

What is claimed is:

1. A method of forming a photovoltaic device, comprising:
    forming a back electrode layer directly contacting a substrate;
    forming a back reflector directly contacting the back electrode layer, the back reflector comprising a plurality of first lines disposed parallel to a first axis and a plurality of second lines disposed parallel to a second axis, wherein the first axis is perpendicular to the second axis, and wherein each of the plurality of first lines and the plurality of second lines comprises a first layer formed of a first reflector material and a second layer formed of a second reflector material, wherein the second layer is formed in direct physical contact with the back electrode layer and the first layer is formed in direct physical contact with the second layer and not in direct physical contact with the back electrode layer, wherein the first reflector material has a refractive index between 1.5 and 4.5 and the second reflector material has a refractive index between 1.2 and 2.5;
    adjusting a width of at least one first line of the plurality of first lines such that it is different than a width of at least one second line of the plurality of first lines, thereby achieving a coverage ratio of the back reflector to the photovoltaic absorber layer that is between 20% and 90%;
    forming a photovoltaic absorber layer directly contacting the back electrode layer and the back reflector, wherein said back reflector is embedded in said photovoltaic absorber layer, and wherein said photovoltaic absorber layer creates a fully depleted cell;
    forming a buffer layer directly contacting the photovoltaic absorber layer; and forming a front contact layer directly contacting the buffer layer.

2. The method of claim 1, wherein said first reflector material has a refractive index greater than the refractive index of said second reflector material.

3. The method of claim 1, wherein each one of said first layer formed of the first reflector material and said second layer formed of the second reflector material has a depth of about 30 nanometers to 300 nanometers.

4. The method of claim 1, wherein the coverage ratio is between 50% and 80%.

5. The method of claim 1, wherein the back reflector is formed by sputtering using a mask.

6. The method of claim 1, wherein the back reflector has a thickness in the range of 0.1 to 2 microns.

7. The method of claim 1, wherein the first reflector material comprises silicon with a refractive index of 3.6 and the second reflector material comprises silicon oxide with a refractive index of 1.46.

8. The method of claim 1 wherein the back reflector comprises molybdenum and is formed by sputtering.

\* \* \* \* \*